United States Patent
Chidambaram et al.

(10) Patent No.: US 7,642,197 B2
(45) Date of Patent: Jan. 5, 2010

(54) METHOD TO IMPROVE PERFORMANCE OF SECONDARY ACTIVE COMPONENTS IN AN ESIGE CMOS TECHNOLOGY

(75) Inventors: Periannan Chidambaram, Richardson, TX (US); Angelo Pinto, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/774,820

(22) Filed: Jul. 9, 2007

(65) Prior Publication Data
US 2009/0014805 A1 Jan. 15, 2009

(51) Int. Cl.
*H01L 21/302* (2006.01)
*H01L 21/461* (2006.01)

(52) U.S. Cl. .............. 438/752; 438/197; 438/933; 257/E21.32; 257/E21.58; 257/E21.115; 257/E21.127; 257/E21.092; 257/E21.278

(58) Field of Classification Search ............... 438/197, 438/514, 723, 700, 743, 756, 752, 933
See application file for complete search history.

(56) References Cited

U.S. PATENT DOCUMENTS

| | | | |
|---|---|---|---|
| 5,661,316 A | 8/1997 | Kish, Jr. et al. | |
| 6,563,133 B1 | 5/2003 | Tong | |
| 7,060,585 B1 * | 6/2006 | Cohen et al. | 438/355 |
| 7,291,539 B2 * | 11/2007 | Fogel et al. | 438/424 |
| 2006/0244068 A1 * | 11/2006 | Desouza et al. | 257/351 |
| 2006/0275971 A1 * | 12/2006 | Fogel et al. | 438/198 |

FOREIGN PATENT DOCUMENTS

JP 08-022964 A 1/1996

* cited by examiner

*Primary Examiner*—David Nhu
(74) *Attorney, Agent, or Firm*—Warren L. Franz; Wade J. Brady, III; Frederick J. Telecky, Jr.

(57) ABSTRACT

According to various embodiments, there are eSiGe CMOS devices and methods of making them. The method of making a substrate for a CMOS device can include providing a DSB silicon substrate including a first bonded to a second layer, wherein each layer has a (100) oriented surface and a first direction and a second direction and the first direction of the first layer is approximately aligned with the second direction of the second layer. The method can also include performing amorphization on a selected region of the first layer to form a localized amorphous silicon region and recrystallizing the localized amorphous silicon region across the interface using the second layer as a template, such that the first direction of the first layer in the selected region is approximately aligned with the first direction of the second layer.

20 Claims, 5 Drawing Sheets

METHOD TO IMPROVE PERFORMANCE OF SECONDARY ACTIVE COMPONENTS IN AN ESIGE CMOS TECHNOLOGY

FIELD OF THE INVENTION

The subject matter of this invention relates to methods of fabricating semiconductor devices. More particularly, the subject matter of this invention relates to the methods of making eSiGe CMOS devices with improved performance of secondary active components.

BACKGROUND OF THE INVENTION

With increasing demands and shrinking sizes of the consumer handheld electronics, there is a growing need to improve transistor performance. There are several ways of improving carrier mobility and, hence, transistor performance: using uniaxially strained silicon using tensile or compressive stressors; using biaxially strained silicon on relaxed silicon germanium virtual substrates; or using biaxially strained silicon on insulator. Transistors with silicon germanium source/drain regions have been demonstrated for mobility and drive current enhancement. However, this process induced stress engineering technique cannot be used in many secondary components like input/output and long channel transistors, drain extended metal oxide semiconductors (DEMOS), pnp transistors, etc. Furthermore, it has been established that shallow trench isolation regions generate compressive stress inside the active regions. This causes large mobility and drive current degradation for secondary active components.

Thus, there is a need to overcome these and other problems of the prior art and to provide methods of improving mobility and drive current for secondary active components in a CMOS device.

SUMMARY OF THE INVENTION

In accordance with the invention, there is a method of making an embedded silicon germanium (eSiGe) CMOS device. The method can include providing a direct semiconductor bonded (DSB) silicon substrate including a first layer having a (100) oriented surface bonded to a second layer having a (100) oriented surface, wherein a <110> direction of the first layer is approximately aligned with a <100> direction of the second layer. The method can also include performing amorphization on a selected region of the first layer to form a localized amorphous silicon region extending at least up to an interface of the first layer and the second layer, and recrystallizing the localized amorphous silicon region across the interface using the second layer as a template, such that the <100> direction of the first layer in the selected region is approximately aligned with the <100> direction of the second layer. The method can further include forming an embedded silicon germanium layer along the <110> direction in the first layer of the direct semiconductor bonded (DSB) silicon substrate.

According to various embodiments of the present teachings, there is a method of making a substrate for a CMOS device including providing a direct semiconductor bonded (DSB) silicon substrate including a first layer having a (100) oriented surface bonded to a second layer having a (100) oriented surface, wherein the first layer and the second layer each has a first direction and a second direction and the first direction of the first layer is approximately aligned with the second direction of the second layer. The method can also include performing amorphization on a selected region of the first layer to form a localized amorphous silicon region extending at least up to an interface of the first layer and the second layer and recrystallizing the localized amorphous silicon region across the interface using the second layer as a template, such that the first direction of the first layer in the selected region is approximately aligned with the first direction of the second layer and the second direction of the first layer in the selected region is approximately aligned with the second direction of the second layer.

According to various embodiments of the present teachings, there is a CMOS device. The CMOS device can include a direct semiconductor bonded (DSB) silicon substrate comprising a first layer having a (100) oriented surface bonded to a second layer having a (100) oriented surface and a first region and a second region, wherein a <110> direction of the first layer is approximately aligned with a <100> direction of the second layer in the first region and a <100> direction of the first layer is approximately aligned with the <100> direction of the second layer in the second region. The CMOS device can also include one or more key active components in the first region, wherein each of the one or more key active components comprises one or more device channels oriented along the <110> direction on the (100) plane of the DSB silicon substrate. The CMOS device can further include one or more secondary active components in the second region, wherein each of the one or more secondary active components comprises one or more device channels oriented along the <100> direction on the (100) plane of the DSB silicon substrate.

In accordance with the present teachings, there is a method of making a substrate for an embedded silicon germanium (eSiGe) CMOS device. The method can include providing a direct semiconductor bonded (DSB) silicon substrate including a first layer having a (100) oriented surface bonded to a second layer having a (100) oriented surface, wherein the first layer and the second layer each has a first direction and a second direction and the first direction of the first layer is approximately aligned with the second direction of the second layer. The method can also include etching through an etch mask a selected region of the first layer to form a localized recess extending at least up to an interface of the first layer and the second layer and epitaxially growing silicon in the localized recess using the second layer as a template, such that the first direction of the first layer in the selected region is approximately aligned with the first direction of the second layer and the second direction of the first layer in the selected region is approximately aligned with the second direction of the second layer.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. -1, -2, -3, -10, -20, -30, etc.

Figure 1A:
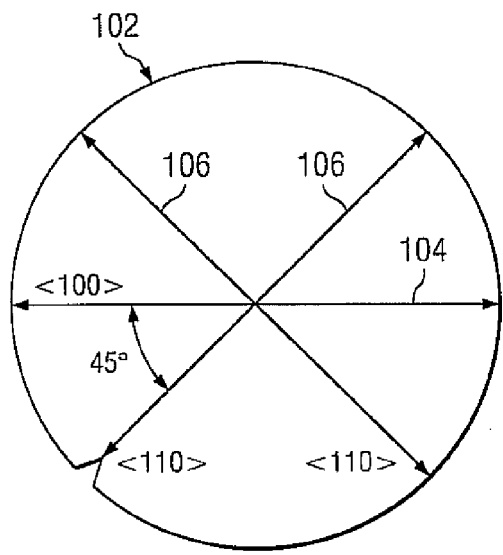
FIGS. 1A and 1B show schematic illustrations of top views of the first layer and the second layer of the direct semiconductor bonded silicon substrate and FIG. 1C is a side view of the direct semiconductor bonded silicon substrate.
Figure 1B:
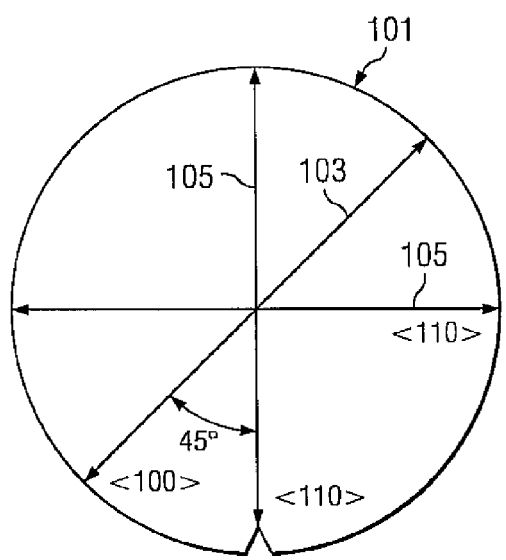
Figure 1C:
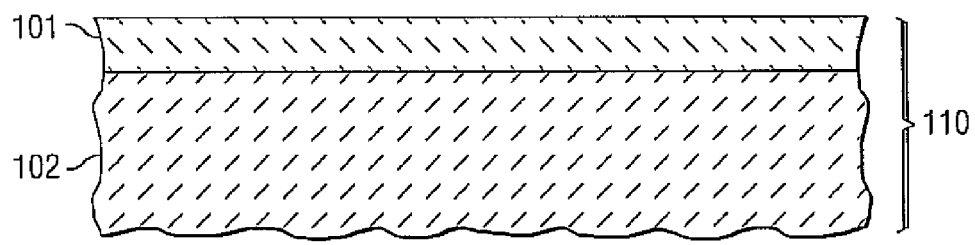

FIGS. 1A and 1B show schematic illustrations of top views of a first layer 101 and a second layer 102 of a direct semiconductor bonded (DSB) silicon substrate 110. FIG. 1C is a schematic illustration of a side view of the direct semiconductor bonded (DSB) silicon substrate 110. In various embodiments, the DSB silicon substrate 110 can include a first layer 101 having a (100) oriented surface bonded to a second layer 102 having a (100) oriented surface, wherein a <110> direction 105 of the first layer 101 is approximately aligned with a <100> direction 104 of the second layer 102. In various embodiments, the first layer 101 of the direct semiconductor bonded (DSB) silicon substrate 110 can have a thickness from about 50 nm to about 300 nm.

Figure 2A:
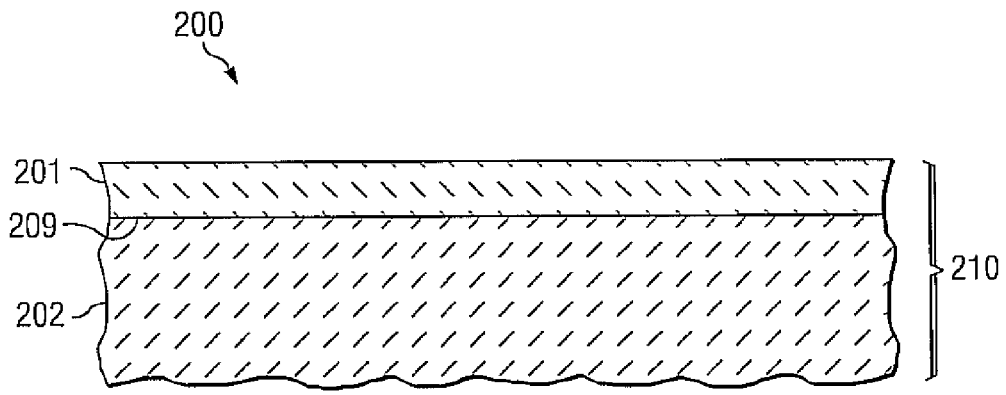
FIGS. 2A-2C depict schematic illustrations of an exemplary method of making a substrate for a CMOS device, according to various embodiments of the present teachings.
Figure 2B:
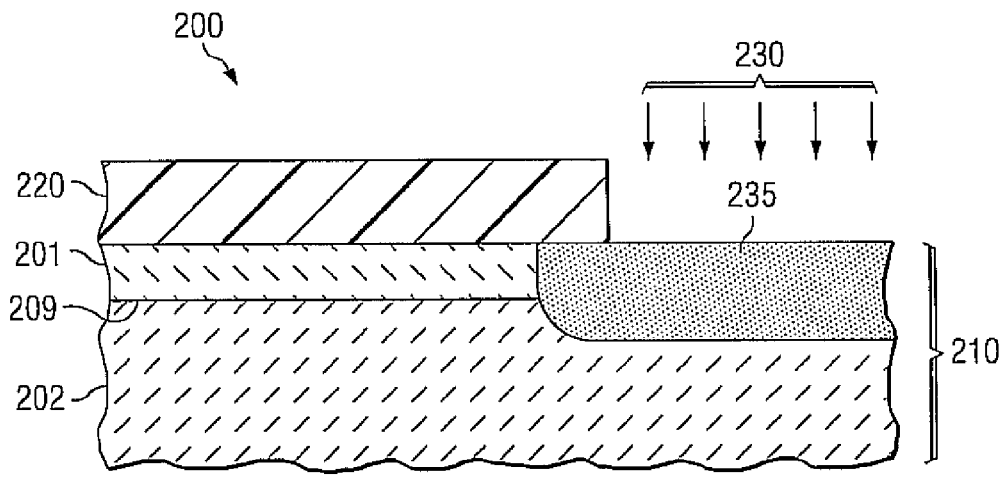
Figure 2C:
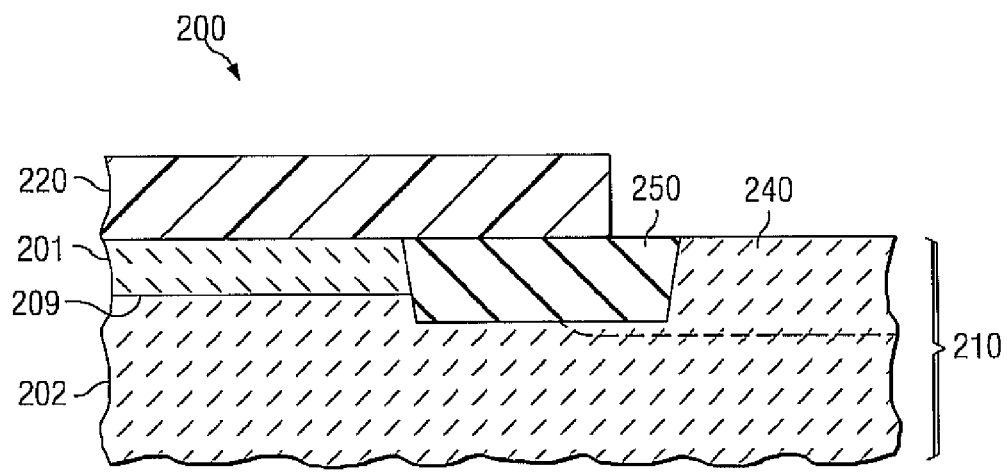

FIGS. 2A-2C depict schematic illustrations of an exemplary method of making a substrate 210 for a CMOS device 200. The method can include providing a direct semiconductor bonded (DSB) silicon substrate 210 including a first layer 201 having a (100) oriented surface bonded to a second layer 202 having a (100) oriented surface, wherein the first layer 201 and the second layer 202 each has a first direction and a second direction and the first direction of the first layer 201 is approximately aligned with the second direction of the second layer 202. In some embodiments, the first direction can be <100> and the second direction can be <100>. In other embodiments, the first direction can be <110> and the second direction can be <110>, as shown in FIG. 1C. The method can further include performing amorphization 230 on a selected region of the first layer 201 to form a localized amorphous silicon region 235 extending at least up to an interface 209 of the first layer 201 and the second layer 202, as shown in FIG. 2B. In some embodiments, a photoresist layer 220 can be deposited over the first layer 201 and using photolithography, a region can be selected for amorphization, as shown in FIG. 2B. In other embodiments, amorphization 230 on a selected region of the first layer 201 can be performed through a mask (not shown). Amorphization can be carried out by any suitable means. In various embodiments, amorphization can be performed by ion implantation/bombardment, involving bombarding the surface with ions. Almost any type of ion can be used for amorphization, including, for example, ions of Ge, Sb, In, Si, Ar, and F. Amorphization can generally be achieved by bombarding with about $1 \times 10^{13}$ to about $1 \times 10^{15}$ ions/cm$^2$ at an energy from about 1 keV to about 100 keV.

The method of making the substrate 210 for a CMOS device 200 can also include recrystallizing the localized amorphous silicon region 235 across the interface 209 using the second layer 202 as a template, such that the first direction of the first layer 201 in the selected region 240 is approximately aligned with the first direction of the second layer 202 and the second direction of the first layer 201 in the selected region 240 is approximately aligned with the second direction of the second layer 202, as shown in FIG. 2C. For example, after recrystallization, the <100> direction of the first layer 201 in the selected region 240 can be approximately aligned with the <100> direction of the second layer 202. In various embodiments, the step of recrystallizing the localized amorphous silicon region 235 can include thermal processing of the localized amorphous silicon region 235. In some embodiments, recrystallization of the localized amorphous silicon region 235 can be carried out at a temperature from about 400° C. to about 1100° C. The process of recrystallization of the localized amorphous silicon region 235 thermally is also called solid phase epitaxy (SPE). In various embodiments, the method of making the substrate 210 for a CMOS device can also include making a trench isolation region 250 between the selected region 240, wherein the first direction of the first layer 201 is approximately aligned with the first direction of the second layer 202, and the region of first layer 201, wherein the first direction of the first layer 201 is approximately aligned with the second direction of the second layer 202. The method can further include removing the photoresist layer 220.

Figure 3A:
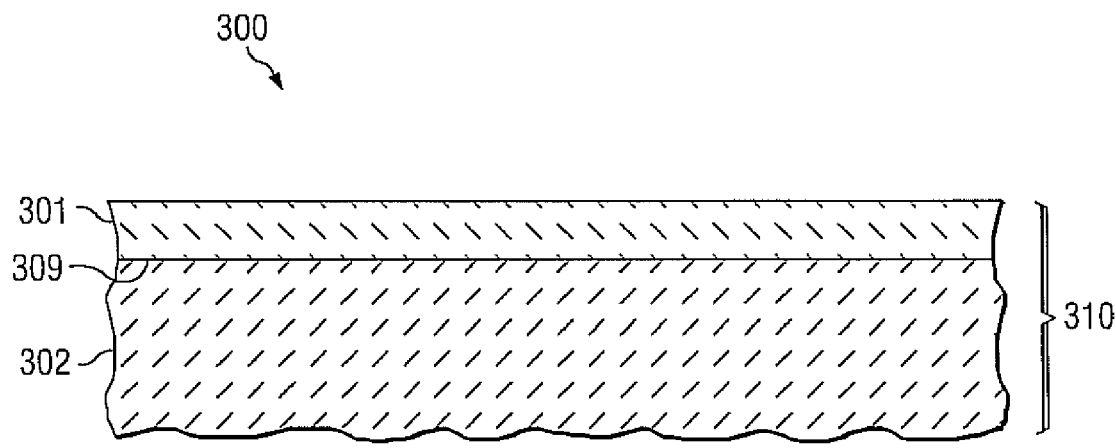
FIGS. 3A-3D depict schematic illustrations of an exemplary method of making an embedded silicon germanium (eSiGe) CMOS device, according to various embodiments of the present teachings.
Figure 3B:
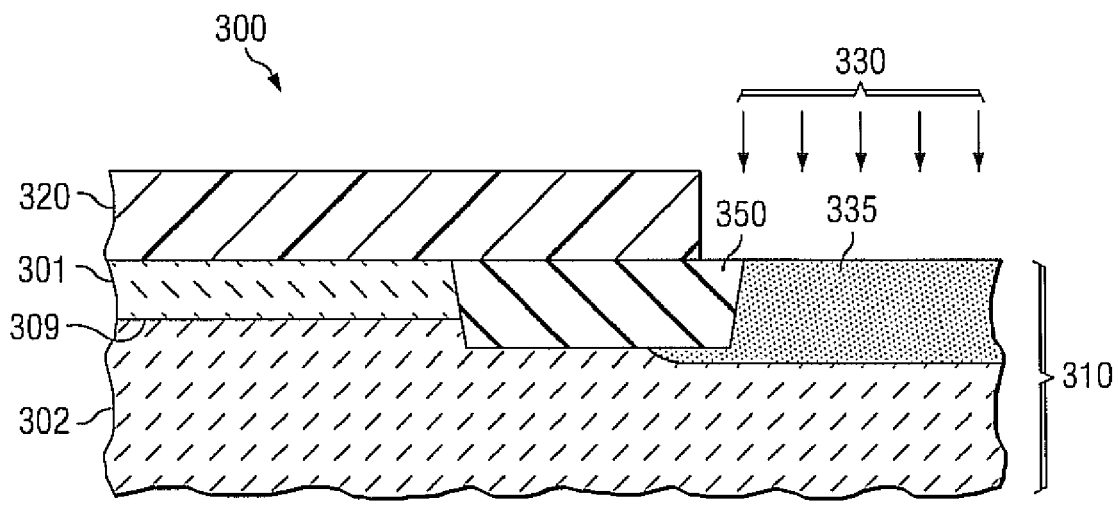
Figure 3C:
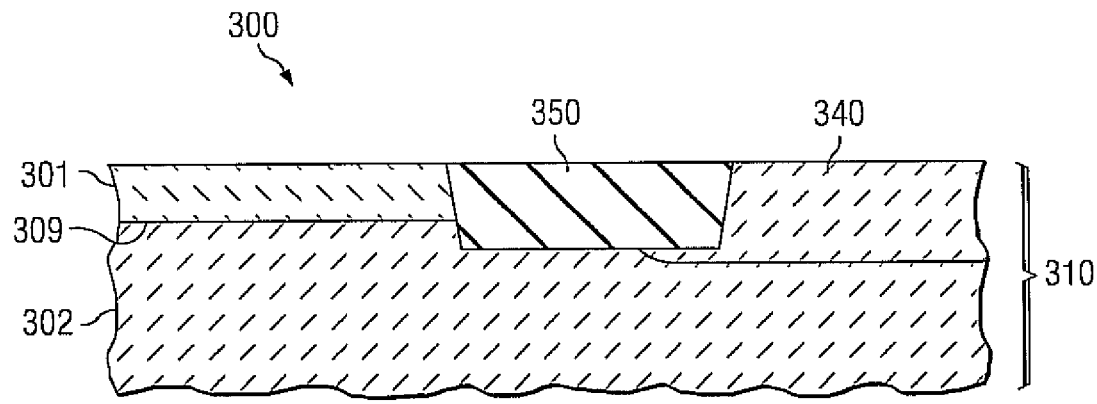

FIGS. 3A-3D depict schematic illustrations of an exemplary method of making an embedded silicon germanium (eSiGe) CMOS device 300, according to various embodiments of the present teachings. The method can include providing a direct semiconductor bonded (DSB) silicon substrate 310 including a first layer 301 having a (100) oriented surface bonded to a second layer 302 having a (100) oriented surface, wherein a <110> direction (shown by hatched line) of the first layer 301 is approximately aligned with a <100> direction (shown by hatched line) of the second layer 302, as shown in FIG. 3A. In various embodiments, the first layer 301 of the direct semiconductor bonded (DSB) silicon substrate 310 can have a thickness from about 50 nm to about 300 nm. The method can also include performing amorphization 330 on a selected region of the first layer 301 to form a localized amorphous silicon region 335 extending at least up to an interface 309 of the first layer 301 and the second layer 302, as shown in FIG. 3B. In some embodiments, a photoresist layer 320 can be deposited over the first layer 301 and using photolithography, a region can be selected for amorphization 330, as shown in FIG. 3B. In other embodiments, amorphization 330 on a selected region of the first layer 301 can be performed through a mask (not shown). In various embodiments, the localized amorphous silicon region 335 can be predominantly formed within the first layer 301. In some embodiments, the localized amorphous silicon region 335 can have a thickness from about 50 nm to about 300 nm. In various embodiments, the method of making an embedded silicon germanium (eSiGe) CMOS device 300 can also include forming one or more trench isolation regions 350 before the step of performing amorphization 330 on the selected region of the first layer 301 of the direct semiconductor bonded (DSB) silicon substrate 310. The trench isolation region 350 can have a thickness from about 150 nm to about 300 nm.

The method of making an embedded silicon germanium (eSiGe) CMOS device 300 can further include recrystallizing the localized amorphous silicon region 335 across the interface 309 using the second layer 302 as a template, such that the <100> direction (shown by hatched line) of the first layer 301 in the selected region 340 is approximately aligned with the <100> direction (shown by hatched line) of the second layer 302. In some embodiments, the localized amorphous silicon region 335 can be recrystallized by heating to a temperature of from about 400° C. to about 1100° C.

Figure 3D:
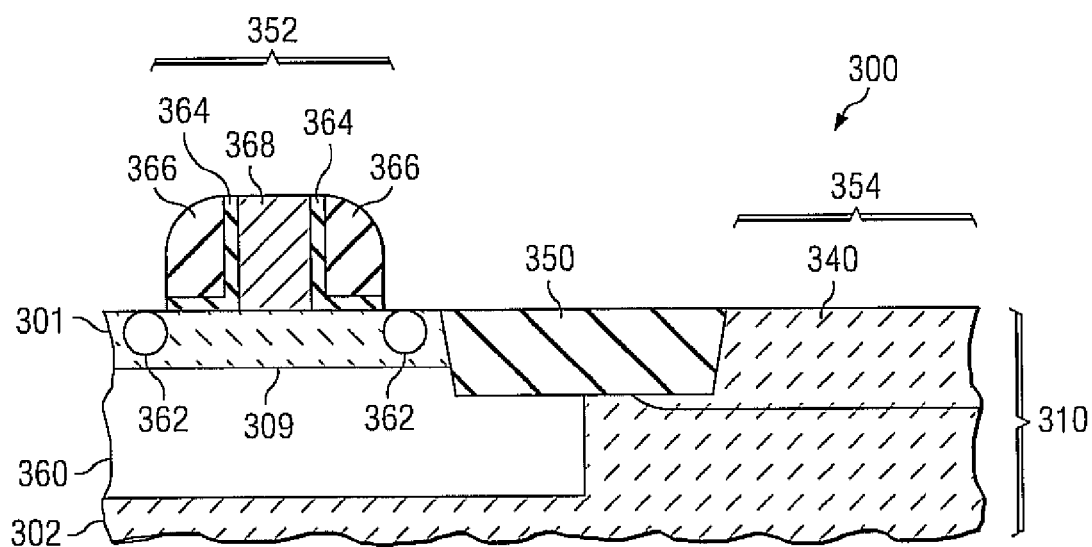

The method of making an embedded silicon germanium (eSiGe) CMOS device 300 can also include forming an embedded silicon germanium layer 362 along the <110> direction in the first layer 301 of the (DSB) silicon substrate 310, as shown in FIG. 3D. The method can further include forming one or more key active components selected from the group consisting of nMOS and pMOS wherein each of the one or more key active components includes one or more device channels oriented along the <110> direction on the (100) plane of the DSB silicon substrate 310. FIG. 3D shows an exemplary PMOS device in a first region 352 including an N-well region 360, a first spacer 364, a second spacer 366, and a gate 368. In some embodiments, the first spacer 364 can be formed of any suitable oxide and the second spacer 366 can be formed of any suitable nitride. In other embodiments, the gate 368 can be formed of any suitable conductive material. In some other embodiments, the method can also include forming one or more secondary active components (not shown) in a second region 354, selected from the group consisting of transistors, input/output devices, capacitors, and diodes, wherein each of the one or more secondary active components includes one or more device channels oriented along the <100> direction on the (100) plane of the DSB silicon substrate 310.

According to various embodiments, there is a CMOS device 300 as shown in FIG. 3D. The CMOS device 300 can include a direct semiconductor bonded (DSB) silicon substrate 310 including a first layer 301 having a (100) oriented surface bonded to a second layer 302 having a (100) oriented surface and a first region 352 and a second region 354, wherein a <110> direction of the first layer 301 is approximately aligned with a <100> direction of the second layer 302 in the first region 352 and a <100> direction of the first layer 301 is approximately aligned with the <100> direction of the second layer 302 in the second region 354. The CMOS device 300 can also include one or more key active components in the first region 352, wherein each of the one or more key active components can include one or more device channels oriented along the <110> direction on the (100) plane of the DSB silicon substrate 310. In various embodiments, the one or more key active components can be selected from the group consisting of PMOS and NMOS devices. FIG. 3D shows an exemplary PMOS device in the first region 352 including an N-well region 360, a first spacer 364, a second spacer 366, and a gate 368. The CMOS device can further include one or more secondary active components (not shown) in the second region 354, wherein each of the one or more secondary active components comprises one or more device channels oriented along the <100> direction on the (100) plane of the DSB silicon substrate 310. In some embodiments, the one or more secondary active components can be selected from the group consisting of transistors, input/output devices, capacitors, and diodes. In various embodiments, the CMOS device 300 can also include one or more trench isolation regions, wherein each of the one or more trench isolation regions separates the first region from the second region.

Figure 4A:
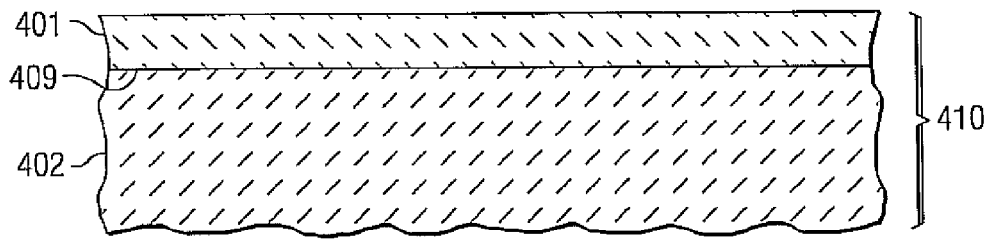
FIGS. 4A-4D depict schematic illustrations of an exemplary method of making a substrate for an embedded silicon germanium (eSiGe) CMOS device
Figure 4B:
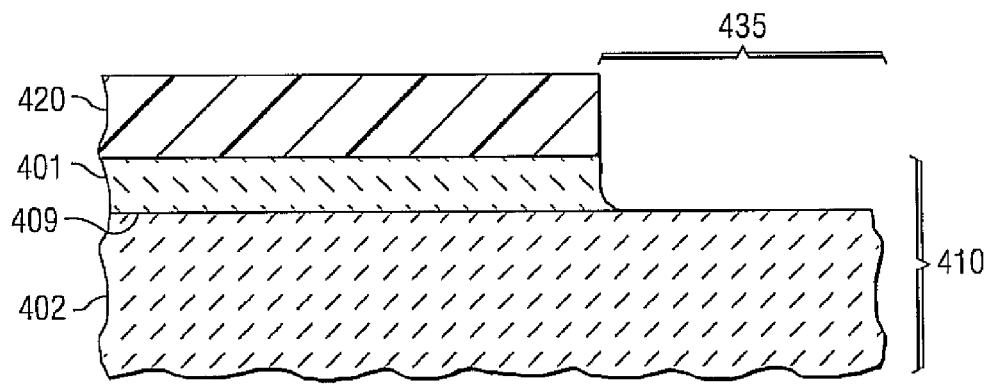
Figure 4C:
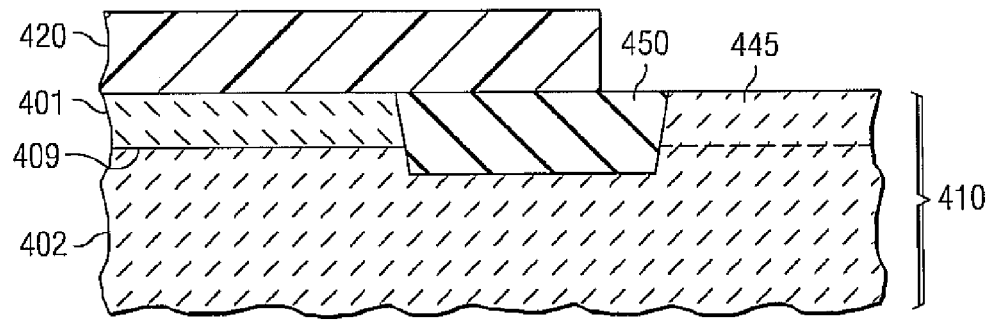
Figure 4D:
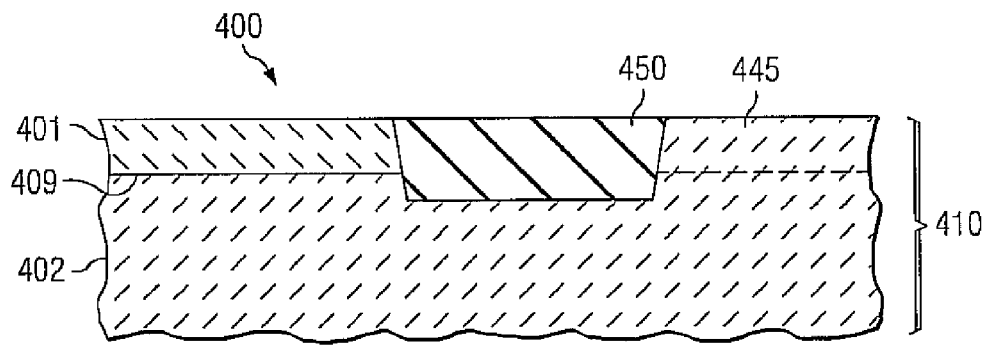

According to various embodiments, there is a method of making a substrate 400 for an embedded silicon germanium (eSiGe) CMOS device, as shown in FIGS. 4A-4D. The method can include providing a direct semiconductor bonded (DSB) silicon substrate 410 including a first layer 401 having a (100) oriented surface bonded to a second layer 402 having a (100) oriented surface, as shown in FIG. 4A, wherein the first layer 401 and the second layer 402 each has a first direction and a second direction and the first direction of the first layer 401 is approximately aligned with the second direction of the second layer 402. The method can further include etching through an etch mask 420 a selected region of the first layer 401 to form a localized recess 435 extending at least up to an interface 409 of the first layer 401 and the second layer 402 as shown in FIG. 4B. In some embodiments, the etch mask can be a photoresist layer. In other embodiments, the etch mask 420 can be a silicon oxide layer. In various embodiments, etching can include anisotropic etch processes such as, for example, reactive ion etching and plasma etching. In some embodiments, etching can be done using etchants such as, for example a mixture of hydrogen bromide and silicon tetrachloride and one or more silicon-dangling bond passivants selected from the group consisting of CO, $H_2O$, $NO_2$, NOCl, CO, and $CS_2$. The method can further include epitaxially growing silicon in the localized recess 435 using the second layer 402 as a template as shown in FIG. 4C, such that the first direction of the first layer 401 of the epitaxially grown silicon 445 is approximately aligned with the first direction of the second layer 402, and the second direction of the first layer 401 of the epitaxially grown silicon 445 is approximately aligned with the second direction of the second layer 445. In various embodiments, the method can also include removing the etch mask 420 and chemical mechanical polishing the epitaxially grown silicon 445, as shown in FIG. 4D. In various embodiments, the method of making the substrate 400 for a CMOS device can also include making a trench isolation region 450 between the selected region 445, wherein the first direction of the first layer 401 is approximately aligned with the first direction of the second layer 402 and the region of first layer 401, wherein the first direction of the first layer 401 is approximately aligned with the second direction of the second layer 402.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making an embedded silicon germanium (eSiGe) CMOS device comprising:
   providing a direct semiconductor bonded (DSB) silicon substrate comprising a first layer having a (100) oriented surface bonded to a second layer having a (100) oriented surface, wherein a <110> direction of the first layer is approximately aligned with a <100> direction of the second layer;
   performing amorphization on a selected region of the first layer to form a localized amorphous silicon region extending at least up to an interface of the first layer and the second layer;
   recrystallizing the localized amorphous silicon region across the interface using the second layer as a template, such that the <100> direction of the first layer in the selected region is approximately aligned with the <100> direction of the second layer; and
   forming an embedded silicon germanium layer along the <110> direction in the first layer of the direct semiconductor bonded (DSB) silicon substrate.

2. The method of making an embedded silicon germanium (eSiGe) CMOS device according to claim 1, wherein the localized amorphous silicon region is formed predominantly within the first layer of the DSB silicon substrate.

3. The method of making an embedded silicon germanium (eSiGe) CMOS device according to claim 1, further comprising forming one or more trench isolation regions.

4. The method of making an embedded silicon germanium (eSiGe) CMOS device according to claim 1, further comprising forming one or more trench isolation regions before the step of performing amorphization on the selected region of the first layer.

5. The method of making an embedded silicon germanium (eSiGe) CMOS device according to claim 1, further comprising forming one or more active components selected from the group consisting of nMOS and pMOS components, wherein each of the one or more active components comprises one or more device channels oriented along the <110> direction on the (100) plane of the DSB silicon substrate.

6. The method of making an embedded silicon germanium (eSiGe) CMOS device according to claim 1, further comprising forming one or more secondary active components selected from the group consisting of transistors, input/output devices, capacitors, and diodes, wherein each of the one or more secondary active components comprises one or more device channels oriented along the <100> direction on the (100) plane of the DSB silicon substrate.

7. The method of making an embedded silicon germanium (eSiGe) CMOS device according to claim 1, wherein amorphization comprises ion implantation.

8. The method of making an embedded silicon germanium (eSiGe) CMOS device according to claim 1, wherein recrystallization of the localized amorphous silicon region is carried out at a temperature from about 400° C. to about 1100° C.

9. A method of making a substrate for a CMOS device comprising:
   providing a direct semiconductor bonded (DSB) silicon substrate comprising a first layer having a (100) oriented surface bonded to a second layer having a (100) oriented surface, wherein the first layer and the second layer each has a first direction on the (100) plane and a second non-equivalent direction on the (100) plane, and the first direction of the first layer is approximately aligned with the second non-equivalent direction of the second layer;
   performing amorphization on a selected region of the first layer to form a localized amorphous silicon region extending at least up to an interface of the first layer and the second layer;
   recrystallizing the localized amorphous silicon region across the interface using the second layer as a template, such that the first direction of the first layer in the selected region is approximately aligned with the first direction of the second layer, and the second non-equivalent direction of the first layer in the selected region is approximately aligned with the second non-equivalent direction of the second layer.

10. The method of making a substrate for a CMOS device according to claim 9, wherein the first direction is <100> and the second direction is <110>.

11. The method of making a substrate for a CMOS device according to claim 9, wherein the first direction is <110> and the second direction is <100>.

12. The method of making a substrate for a CMOS device according to claim 9, wherein the localized amorphous silicon region is formed predominantly within the first layer of the DSB silicon substrate.

13. The method of making a substrate for a CMOS device according to claim 9, wherein amorphization comprises ion implantation.

14. The method of making a substrate for a CMOS device according to claim 9, wherein the step of recrystallizing the localized amorphous silicon comprises thermal processing of the localized amorphous silicon region.

15. A method of making a substrate for an embedded silicon germanium (eSiGe) CMOS device comprising:
   providing a direct semiconductor bonded (DSB) silicon substrate comprising a first layer having a (100) oriented surface bonded to a second layer having a (100) oriented surface, wherein the first layer and the second layer each has a first direction on the (100) plane and a second non-equivalent direction on the (100) plane, and the first direction of the first layer is approximately aligned with the second non-equivalent direction of the second layer;
   etching through an etch mask a selected region of the first layer to form a localized recess extending at least up to an interface of the first layer and the second layer;
   epitaxially growing silicon in the localized recess using the second layer as a template, such that the first direction of the first layer in the selected region is approximately aligned with the first direction of the second layer and the second non-equivalent direction of the first layer in the selected region is approximately aligned with the second non-equivalent direction of the second layer.

16. The method of making a substrate for an embedded silicon germanium (eSiGe) CMOS device according to claim 15, wherein the first direction is <100> and the second non-equivalent direction is <110>.

17. The method of making a substrate for an embedded silicon germanium (eSiGe) CMOS device according to claim 15, wherein the first direction is <110> and the second non-equivalent direction is <100>.

18. A method of making an embedded silicon germanium (eSiGe) CMOS device comprising:
   providing a direct semiconductor bonded (DSB) silicon substrate comprising a first layer having a (100) oriented surface bonded to a second layer having a (100) oriented surface, wherein the first layer and the second layer each has a first <100> direction on the (100) plane and a second <110> direction on the (100) plane, and one of the first <100> direction and the second <110> direction of the first layer is aligned with the other of the first <100> direction and the second <110> direction of the second layer;

performing amorphization on a selected region of the first layer to form a localized amorphous silicon region extending at least up to an interface of the first layer and the second layer;

recrystallizing the localized amorphous silicon region across the interface using the second layer as a template, such that one of the first <100> direction and the second <110> direction of the first layer in the selected region is approximately aligned with the same one of the first <100> direction and the second <110> direction of the second layer; and forming an embedded silicon germanium layer along the other of the first <100> direction and the second <110> direction in the first layer of the direct semiconductor bonded (DSB) silicon substrate.

19. A method of making a substrate for an embedded silicon germanium (eSiGe) CMOS device comprising:

providing a direct semiconductor bonded (DSB) silicon substrate comprising a first layer having a (100) oriented surface bonded to a second layer having a (100) oriented surface, wherein the first layer and the second layer each has a first direction on the (100) plane and a second non-equivalent direction on the (100) plane, and the first direction of the first layer is approximately aligned with the second non-equivalent direction of the second layer;

performing amorphization on a selected region of the first layer to form a localized amorphous silicon region extending at least up to an interface of the first layer and the second layer;

recrystallizing the localized amorphous silicon region across the interface using the second layer as a template, such that the second direction of the first layer in the selected region is approximately aligned with the second direction of the second layer; and forming an embedded silicon germanium layer along the first direction in the first layer of the direct semiconductor bonded (DSB) silicon substrate.

20. A method of making a substrate for an embedded silicon germanium (eSiGe) CMOS device comprising:

providing a direct semiconductor bonded (DSB) silicon substrate including a first layer having a (100) oriented surface bonded to a second layer having a (100)oriented surface, wherein the first layer and the second layer each has a first direction on the (100) plane and a second non-equivalent direction on the (100) plane, and the first direction of the first layer is approximately aligned with the second non-equivalent direction of the second layer;

etching through an etch mask a selected region of the first layer to form a localized recess extending at least up to an interface of the first layer and the second layer;

epitaxially growing silicon in the localized recess using the second layer as a template, such that the first direction of the first layer of the epitaxially grown silicon is approximately aligned with the first direction of the second layer and the second non-equivalent direction of the first layer of the epitaxially grown silicon is approximately aligned with the second non-equivalent direction of the second layer;

removing the etch mask and chemically mechanically polishing the epitaxially grown silicon; and making a trench isolation region between the epitaxially grown silicon and a region of the second layer.

\* \* \* \* \*